(12) United States Patent
Benwadih

(10) Patent No.: US 8,951,830 B2
(45) Date of Patent: Feb. 10, 2015

(54) PROCESS FOR PRODUCING AN ORGANIC SEMICONDUCTOR LAYER CONSISTING OF A MIXTURE OF A FIRST AND A SECOND SEMICONDUCTOR

(71) Applicant: Commissariat A L'Energie Atomique Et Aux Energies Alternatives, Paris (FR)

(72) Inventor: Mohammed Benwadih, Champigny sur Marne (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/713,435

(22) Filed: Dec. 13, 2012

(65) Prior Publication Data

US 2013/0092921 A1 Apr. 18, 2013

Related U.S. Application Data

(63) Continuation of application No. PCT/FR2011/051332, filed on Jun. 10, 2011.

(30) Foreign Application Priority Data

Jul. 22, 2010 (FR) ...................................... 10 55990

(51) Int. Cl.
*H01L 21/3205* (2006.01)
*H01L 51/00* (2006.01)
*H01L 51/42* (2006.01)

(52) U.S. Cl.
CPC ........ *H01L 51/0003* (2013.01); *H01L 51/0007* (2013.01); *H01L 21/32056* (2013.01); *H01L 51/0036* (2013.01); *H01L 51/4253* (2013.01)
USPC .............................................. 438/99; 257/40

(58) Field of Classification Search
CPC ................... H01L 21/32056; H01L 51/0003; H01L 51/0007; H01L 51/424
USPC ................................. 257/40, E51.012; 438/99
See application file for complete search history.

(56) References Cited

U.S. PATENT DOCUMENTS 8,003,881 B2 * 8/2011 Berson et al. .................. 136/243
8,367,458 B2 * 2/2013 Meerholz et al. ............... 438/99

(Continued)

FOREIGN PATENT DOCUMENTS

DE 10 2007 000 791 A1 4/2009

OTHER PUBLICATIONS

Carbon, downloaded Jul. 31, 2014, Wikipeda—the free encyclopedia, pp. 1-20.*

(Continued)

*Primary Examiner* — Allan R Wilson
(74) *Attorney, Agent, or Firm* — Burr & Brown, PLLC

(57) ABSTRACT

A method for manufacturing an organic semiconductor layer formed of a mixture of a first and of a second organic semiconductor materials includes the steps of: forming a porous solid volume formed of the first semiconductor material, of intercommunicating porosity and capable of receiving a second semiconductor material; depositing, at least on an external surface of the porous solid volume, a liquid including the second semiconductor material dissolved or dispersed in a solvent, the solvent being inert with respect to the first semiconductor material and having an evaporation temperature lower than the evaporation temperature of the second semiconductor material; and once the porous solid volume has been at least partially impregnated with the liquid, evaporating the solvent by heating up to a temperature higher than the evaporation temperature of said solvent and lower than the evaporation temperature of the first and of the second semiconductor materials.

3 Claims, 2 Drawing Sheets

(56) References Cited

U.S. PATENT DOCUMENTS

| | | |
|---|---|---|
| 2005/0098204 A1 | 5/2005 | Roscheisen et al. |
| 2006/0160265 A1* | 7/2006 | Morii et al. .................. 438/87 |
| 2007/0221914 A1* | 9/2007 | Becker et al. .................. 257/40 |
| 2009/0050206 A1 | 2/2009 | Halls et al. |
| 2009/0140276 A1* | 6/2009 | Kuratate .................. 257/98 |
| 2009/0194167 A1 | 8/2009 | Brabec |
| 2010/0308307 A1 | 12/2010 | Meerholz et al. |

OTHER PUBLICATIONS

Acetone, downloaded Jul. 31, 2014, Wikipeda—the free encyclopedia, pp. 1-10.*

International Search Report dated Nov. 23, 2011.

* cited by examiner

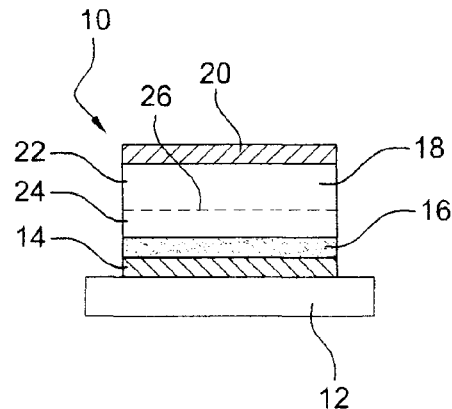
Fig. 1
PRIOR ART
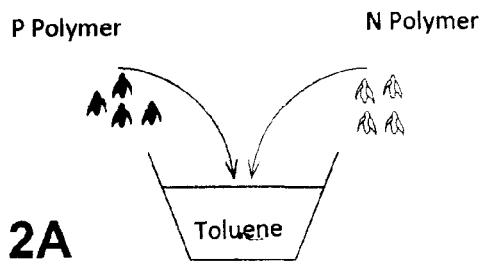
Fig. 2A
PRIOR ART
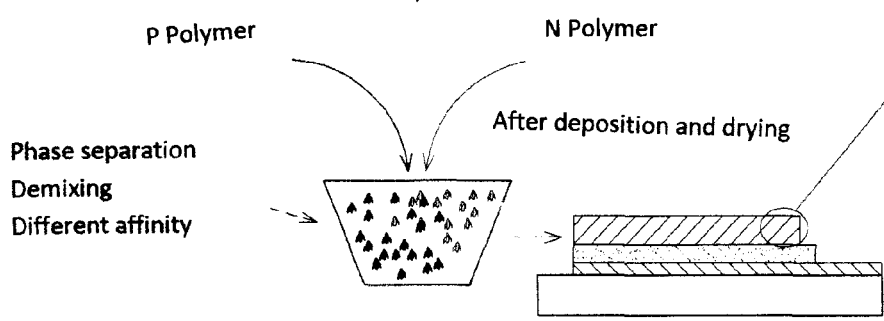
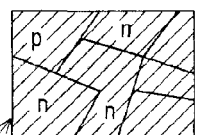
Fig. 2D
PRIOR ART
Fig. 2B
PRIOR ART
Fig. 2C
PRIOR ART

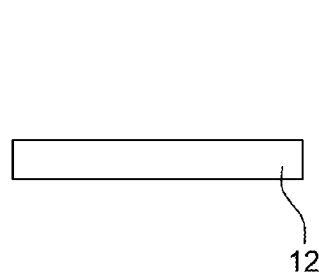 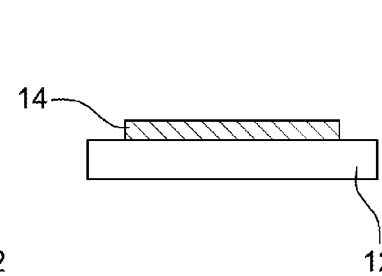 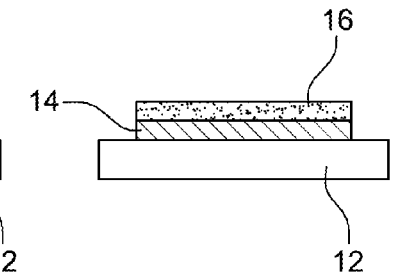
Fig. 3A    Fig. 3B    Fig. 3C
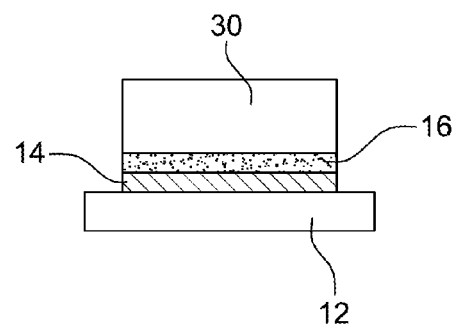 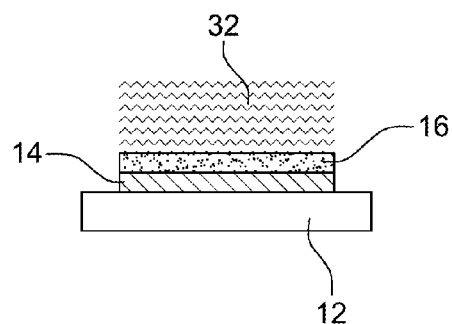
Fig. 3D    Fig. 3E
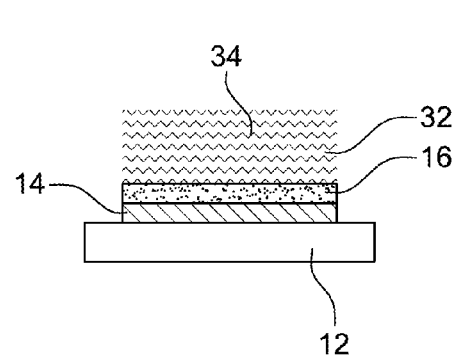 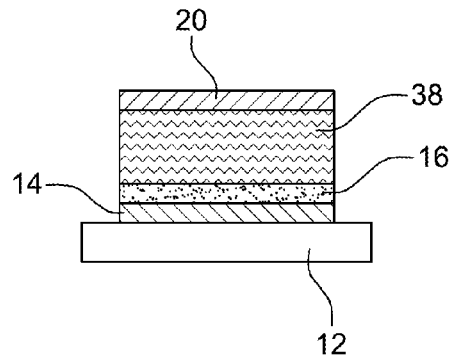
Fig. 3F    Fig. 3G

PROCESS FOR PRODUCING AN ORGANIC SEMICONDUCTOR LAYER CONSISTING OF A MIXTURE OF A FIRST AND A SECOND SEMICONDUCTOR

BACKGROUND OF THE INVENTION

1. Field of the Invention

The invention relates to the manufacturing of organic semiconductor layers formed of a mixture of a first and of a second semiconductor material, more specifically of organic semiconductor layers taking part in the forming of organic opto-electronic devices, especially of photodiodes.

2. Description of Related Art

Referring to FIG. 1, which is a simplified cross-section view of a prior art organic photodiode 10, such a photodiode usually comprises a stack formed, from bottom to top:

- a transparent substrate 12, for example formed of a glass;
- a layer 14 forming a first electrode, for example, formed of an indium-tin oxide, usually called "ITO";
- an injection layer 16, for example formed of a mixture of poly(3,4-ethylenedioxythiophene), commonly referred to as "PEDOT", and of sodium poly(styrenesulfonate), commonly referred to as "PSS", such a mixture being itself usually referred to as "PEDOT:PSS". Injection layer 16 eases the passing of holes from first electrode 14 to active semiconductor layer 18;
- an active semiconductor layer 18 forming a PN junction, formed of a mixture of two organic semiconductor materials P and N, usually a mixture of two polymers, for example, a mixture of poly(3-hexylthiophene), commonly referred to as "P3HT", and of [6,6]-phenyl-$C_{61}$-butyric acid methyl ester, commonly referred to as "DCBM"; and
- a layer 20 forming a second electrode, for example, formed of calcium, of silver, or of aluminum, calcium being preferred due to its low work function which enables to collect electrons only.

In operation, an electromagnetic radiation illuminates substrate 12 and the photons which reach active layer 18 create electron-hole pairs. By submitting electrodes 14 and 20 to a potential difference, a current is then collected, with a value depending on the illumination of photodiode 10.

The efficiency of such a photodiode 10 however depends on the contact surface area existing in active layer 18 between the P-type organic semiconductor material, for example, P3HT, and the N-type organic semiconductor material, for example, PCBM, the efficiency rapidly decreasing as the contact surface area decreases. Further, the efficiency also depends on the size of the domains, the latter having to be of small extension so that charges can cross them to reach the electrode without being recombined. On this regard, an ideal active layer 18 is thus formed of a mixture homogeneous at a molecular scale of the two organic semiconductor materials.

It is however not possible to obtain such a homogeneity with current deposition techniques. Indeed, active layer 18 is usually formed by depositing a solution comprising a solvent having the organic semiconductor materials dissolved or dispersed therein, and by then evaporating the solvent.

When the solvent evaporation rate is too small, a phase separation can then be observed, layer 18 being finally formed of a layer 22 of a first semiconductor material and of a layer 24 of a second semiconductor material. Contact surface 26 between the two materials is then very small and the efficiency of photodiode 10 is thus decreased.

As illustrated in FIGS. 2A-2D, this issue also arises when selecting a highly-volatile solvent, such as for example toluene. Thus, when the two semiconductor materials are mixed in toluene to form a mixture which is initially as homogeneous as possible, for example, by magnetic stirring (FIG. 2A), the obtained solution is very unstable. Local phase separations (FIG. 2B), of thermodynamic origin and due to physico-chemical attraction and repulsion phenomena between molecules, rapidly appear even before the solution is deposited on first electrode 14 (FIG. 2C). This phenomenon carries on during the evaporation of the volatile solvent and large areas formed of a single type of material can be finally observed in layer 18 (FIG. 2D).

Thus, it can usually be observed that 80% of the areas have at least one dimension greater than 10 μm. The total contact surface area between the two organic semiconductor materials is thus here again decreased, and the photodiode efficiency is low.

Document US-A-2009/050206 describes a method for manufacturing an organic semiconductor layer comprising a porous volume made of a first semiconductor material having its pores filled with a second semiconductor material. The porous volume is manufactured by using a phase separation of two materials mixed in a solution, and then, after the solution has solidified, the second material is removed to clear the lateral pores. First, with such a porous volume manufacturing method, it is difficult to accurately set the pore geometry, and especially their dimensions, and there further remain residues of the second material, which adversely affects the quality of the organic semiconductor layer.

SUMMARY OF THE INVENTION

The present invention aims at solving the above-mentioned issue by providing a method for manufacturing an organic semiconductor layer formed of two organic semiconductor materials having a large contact surface area between these materials, that is, a porous volume made of a first semiconductor material having its pores at least partially impregnated with a second semiconductor material, which enables to improve the setting of the pore geometry and enables to obtain a porous volume with no residues capable of adversely affecting the quality of the organic semiconductor layer.

To achieve this, the method for manufacturing such a layer comprises:

- forming a porous solid volume formed of the first semiconductor material, of intercommunicating porosity capable of receiving a second semiconductor material;
- depositing, at least on an external surface of the porous solid volume, a liquid comprising the second semiconductor material dissolved or dispersed in a solvent, the solvent being inert with respect to the first semiconductor material and having an evaporation temperature smaller than the evaporation temperature of the second semiconductor material; and
- once the porous solid volume is at least partially impregnated with the liquid, evaporating the solvent by heating at a temperature higher than the evaporation temperature of said solvent and lower than the evaporation temperature of the first and of the second semiconductor material.

The forming of the porous liquid comprises introducing gas bubbles into a solution of first semiconductor material dissolved or dispersed in a solvent, followed by the evaporation of said solvent, the solvent temperature being lower than the gas evaporation temperature.

Porous material of "intercommunicating porosity" here means a material having its pores communicating with one another to create a space internal to the material which can be accessed from the outside, and which is thus "finable".

In other words, prior to placing the two organic materials in contact, a stable large contact surface area is created. This surface area is then indifferent to the lack of physico-chemical affinity of the two semiconductor materials, and a highly-homogeneous semiconductor layer is obtained with an improved bonding between the two semiconductor materials. For example, a large increase of the efficiency of an organic photodiode by a factor ranging between 5 and 100 can be observed.

Then, the manufacturing of the porous solid volume enables, on the one hand, to obtain a great diversity of pore sizes and densities, and on the other hand, to form "clean" materials free of residues.

Indeed, the use of a gas enables to obtain bubbles smaller than the drops which can be obtained by emulsion of one or several materials in a solvent, which thus enables to have a very fine porosity, and thus a high density of pores homogeneously distributed across the entire volume of the first material forming the porous volume. Further, according to the selected gas, the gas bubbles will be of variable size, which enables to adjust the pore size with an increased accuracy.

Further, the gas evaporation leaves no residue in the final porous solid volume.

According to an embodiment of the invention, the first semiconductor material is P3HT and the second semiconductor material is PCBM.

The invention also aims at an optoelectronic device comprising a semiconductor layer formed in accordance with the above-described method and interposed between a first and a second electrode.

BRIEF DESCRIPTION OF THE DRAWINGS

The present invention will be better understood on reading of the following description provided as an example only, in relation with the accompanying drawings, in which the same reference numerals designate the same or similar elements, and among which:

FIG. 1 is a simplified cross-section view of an organic photodiode of the state of the art;

FIGS. 2A to 2D illustrate a method of the state of the art for depositing a solution of two organic semiconductor materials in a volatile solvent to form the active layer of the organic photodiode of the state of the art; and FIGS. 3A to 3G are simplified cross-section views of different steps of the method for manufacturing an organic photodiode according to the present invention.

DETAILED DESCRIPTION OF THE INVENTION

Referring to FIGS. 3A to 3G, a method for manufacturing an organic photodiode according to the invention conventionally starts with the forming of a glass substrate 12 (FIG. 3A), followed by the forming of an ITO metallization 14 by etching on substrate 12 to form the first electrode of the photodiode (FIG. 3B). The method then conventionally carries on with the deposition of a PEDOT:PPS injection layer 16 on first electrode 14 (FIG. 3C).

The method carries on with the manufacturing of a porous P3HT layer. More specifically, P3HT is dissolved or dispersed in a first solvent "B", such as an alkane, for example. The solution thus obtained is mixed with a second solvent "C" non-miscible with first solvent "B", having an evaporation temperature lower than that of first solvent "B". For example, the first solvent is chlorobenzene or chloroform. The mixture thus obtained is emulsified, for example, by mechanical stirring, and emulsion 30 is deposited on injection layer 16 (FIG. 3D).

Second solvent "C" is then evaporated, for example, by heating at a temperature higher than or equal to the evaporation temperature thereof but lower than the evaporation temperature of first solvent "B". Then, first solvent "B" is evaporated, for example, by heating at a temperature higher than the evaporation temperature thereof.

A P3HT porous solid layer 32, having an open porosity capable of receiving a PCBM solution, is thus obtained (FIG. 3E). Layer 32 has pores of diameter 100 nm, with a distribution (linear) of 10 pores/$\mu m$ over a total 500-$\mu m^2$ surface area.

The properties of the emulsion, and especially the size of the P3HT droplets in first solvent B and their concentration in second solvent C, set the final porosity of porous layer 32. It is thus possible to form a layer 32 with macropores, having a width greater than 50 nanometers, with mesopores, having a width ranging between 2 nanometers and 50 nanometers, or with micropores, having a width smaller than 2 nanometers. The pore size is determined by the nature of the solvents, by the extent of their non-miscibility, and by their evaporation rate.

Advantageously, an additive may also be added to the emulsion just described to stabilize it, especially in case of a high concentration of droplets. For example, the additive is a surface active agent, an emulsifier such as, for example, biological macromolecules, fine particles, for example, of soap, or polymers, for example, hydrophilic amine polymers such as amino-trimethoxysilane.

Further, emulsifiers have the advantage of taking down the interfacial tension between the two solvents to a few millinewtons per meter, or even a few micronewtons per meter, when they are in the presence of a surface active agent, which enables to decrease the power necessary to increase the interface area. This preserves the small size of the domains, the porosity thus being increased.

The method then carries on with the deposition of a PCBM solution 34 in a third solvent "A", for example, cyclohexane, on the free surface of porous layer 32. Thus solution then completely impregnates porous layer 32 (FIG. 3F).

Third solvent "A" used to dissolve or disperse the PCBM is selected to have an evaporation temperature lower than that of PCBM, and advantageously to be volatile. This solvent is also selected to be inert with respect to the material forming porous layer 32, P3HT in this example, to avoid dissolving back this material.

A heating of porous layer 32 impregnated with the PCBM solution is then carried out at a temperature higher than or equal to the evaporation temperature of the third solvent, but lower than the evaporation temperature of PCBM. An organic semiconductor layer 38 formed of a mixture of P3HT and PCBM with a high degree of homogeneity is thus obtained (FIG. 3G).

The method then ends with the deposition on the free surface of layer 38 of a layer 20 forming the second electrode, for example, a calcium, aluminum, or silver layer (FIG. 3G).

In the foregoing, the porous layer is obtained by emulsion.

As a variation, the porous layer is obtained by polymerizing of polystyrene. A porous polystyrene, having its porosity directly obtained during its polymerizing, is used. The polystyrene pores are first filled with the first material, and then with the second material. The polystyrene then remains an inactive skeleton.

According to the invention, the porous layer is obtained by addition of gas, that is, by forming of foam. Gas bubbles are introduced into a solution comprising the first material. During the solvent evaporation, the bubbles then remain trapped if the solvent evaporation temperature is lower than the gas evaporation temperature. The solvent thus evaporates as the gas is released. The latter may be artificially introduced (air, $CO_2$ . . . ) or may be created in situ by the polymerizing of the first material, which creates residues ($CO_2$ . . . ) for example, the polymerizing of polyurethane or of epoxy resin.

The size of the gas bubbles and the nature of the gas enable to accurately set the geometry of the pores, especially their size and density.

Similarly, an embodiment where a porous P3HT layer is filled with PCBM has been described. As a variation, a porous PCBM layer is filled with P3HT.

Similarly, an embodiment where P3HT and PCBM are used has been described. Of course, other types of organic semiconductor materials, of polymer or non-polymer type, may be used according to the targeted application. The selection of the first and second solvents used to form the emulsion which provides the active organic layer after removal thereof obviously depends on the selection of the organic semiconductor materials. It should only be noted that the solvents are selected to be non-miscible, or very little miscible together, and that the evaporation temperature of the second solvent is lower than the evaporation temperature of the first solvent.

Similarly, an embodiment where an organic photodiode is manufactured has been described. Of course, the organic semiconductor layer formed of the mixture of semiconductor materials obtained by the manufacturing method according to the present invention may be used in other types of organic microelectronic components, such as for example an ambipolar transistor.

The invention claimed is:

1. A method for manufacturing an organic semiconductor layer formed of a mixture of a first and of a second organic semiconductor materials, the method comprising:
    forming a porous solid volume formed of the first semiconductor material having an intercommunicating porosity and capable of receiving a second semiconductor material,
    wherein the forming of the porous solid volume comprises adding a gas for introducing gas bubbles into a solution of the first semiconductor material dissolved or dispersed in a solvent A, followed by evaporating said solvent A, the evaporation temperature of said solvent A being lower than the gas evaporation temperature;
    depositing, at least on an external surface of the porous solid volume, a liquid comprising the second semiconductor material dissolved or dispersed in a solvent B, said solvent B being inert with respect to the first semiconductor material and having an evaporation temperature lower than the evaporation temperature of the second semiconductor material; and
    once the porous solid volume has been at least partially impregnated with the liquid, evaporating said solvent B by heating up to a temperature higher than the evaporation temperature of said solvent B and lower than the evaporation temperature of the first and of the second semiconductor materials.

2. The method of claim 1, wherein the first semiconductor material is P3HT and the second semiconductor material is PCBM.

3. An optoelectronic device comprising a semiconductor layer manufactured according to the method of claim 1 and interposed between a first and a second electrode.

* * * * *